United States Patent [19]

Gesin

[11] Patent Number: 4,906,858
[45] Date of Patent: Mar. 6, 1990

[54] CONTROLLED SWITCHING CIRCUIT

[75] Inventor: Milford M. Gesin, Forreston, Ill.

[73] Assignee: Honeywell Inc., Minneapolis, Minn.

[21] Appl. No.: 209,944

[22] Filed: Jun. 22, 1988

Related U.S. Application Data

[63] Continuation-in-part of Ser. No. 120,065, Nov. 13, 1987, abandoned.

[51] Int. Cl.$^4$ .................. H02J 1/00; H01H 35/00; G01N 27/72
[52] U.S. Cl. .................. 307/11; 307/117; 324/236; 340/567
[58] Field of Search .................. 307/11, 16, 18, 34, 307/35, 38–41, 116, 117, 126, 140; 250/214 SW, 551, 209, 214 R; 340/541, 600, 555, 674, 567; 361/180; 324/236, 239

[56] References Cited

U.S. PATENT DOCUMENTS

| | | | |
|---|---|---|---|
| 3,219,992 | 11/1965 | Stuchbery et al. | 340/259 |
| 3,656,005 | 4/1972 | Lee | 307/247 |
| 3,740,587 | 6/1973 | Lee | 307/252 |
| 3,867,641 | 2/1975 | Collins | 307/117 |
| 3,875,502 | 4/1975 | Neumaier | 324/37 |
| 3,993,877 | 11/1976 | Sendyk et al. | 179/90 |
| 3,996,510 | 12/1976 | Guichard | 324/41 |
| 4,000,459 | 12/1976 | Little | 324/40 |
| 4,006,408 | 2/1977 | Sugisaki et al. | 324/41 |
| 4,031,408 | 6/1977 | Holz | 307/116 |
| 4,042,876 | 8/1977 | Visioli, Jr. | 324/34 |
| 4,129,785 | 12/1978 | Kadah | 250/551 |
| 4,138,709 | 2/1979 | Colwill | 361/180 |
| 4,188,547 | 2/1980 | Fox | 307/239 |
| 4,199,694 | 4/1980 | Van Zeeland | 307/252 |
| 4,292,542 | 9/1981 | Bajka | 307/28 |
| 4,376,450 | 3/1983 | Fayfield et al. | 137/554 |
| 4,386,114 | 5/1983 | Harms et al. | 427/47 |
| 4,401,174 | 8/1983 | Nemechek | 177/114 |
| 4,414,478 | 11/1983 | Ueda et al. | 307/116 |
| 4,475,089 | 10/1984 | Kahnke | 331/65 |
| 4,484,183 | 11/1984 | Morey | 340/568 |
| 4,501,949 | 2/1985 | Antol et al. | 219/121 |
| 4,581,540 | 4/1986 | Guajardo | 307/117 |
| 4,658,145 | 4/1987 | Awaji | 250/551 |
| 4,658,928 | 4/1987 | Seo | 180/168 |
| 4,663,542 | 5/1987 | Buck et al. | 307/308 |
| 4,678,992 | 7/1987 | Hametta | 324/208 |
| 4,678,994 | 7/1987 | Davies | 324/236 |
| 4,705,151 | 11/1987 | Leigh-Monstevens | 192/111 |

FOREIGN PATENT DOCUMENTS 2550101 5/1977 Fed. Rep. of Germany.
2943911 6/1981 Fed. Rep. of Germany.

Primary Examiner—William M. Shoop, Jr.
Assistant Examiner—Sharon D. Logan
Attorney, Agent, or Firm—Kinney & Lange

[57] ABSTRACT

A controlled electronic switching circuit having a plurality of switches for switching external load circuits at least one of which provides electrical power for the control arrangement and there being at least one switch electrically isolated from the control arrangement. The circuitry, operated as a proximity switch, can be arranged to distinguish between the proximity of ferromagnetic and non-ferromagnetic material objects using a metal layer between the proximity sensing circuit and the object, which layer can be a deposited metal film.

17 Claims, 2 Drawing Sheets

CONTROLLED SWITCHING CIRCUIT

This is a continuation-in-part of Ser. No. 120,065, filed 11/13/87.

BACKGROUND OF THE INVENTION

The present invention relates to commonly controlled multiple electronic switches and, more particularly, to controlled electronic switches in which electrical power for the control arrangement is provided from external load circuits connected to one or more of such switches.

There are many electrical circuit situations in which events in various separate circuits are to be coordinated with one another through there being a more or less simultaneous switching event occurring in each such circuit. If there is not to be actual simultaneous occurrence, at least there is often a requirement that the switching events in one circuit occur approximately simultaneously with those in some of the separate circuits and within a fixed time of switching events occurring in others of those separate circuits.

This desire can be given effect by the use of a set of electrical switches under the control of a common control arrangement. While such functions have often been provided in the past through the use of electrically operated mechanical relay switches, there are currently many situations in which the limitations of such relays are desired to be avoided through the use of electronic switches. Such limitations to be overcome by the use of electronic switches include limits on the speed of switching, limits on the volume of space required for the controlled electronic switches, available power, reliability of operation in adverse environments, etc.

The switching characteristic usually required of such electrical switches is that they either be normally open or normally closed. In a normally open condition or state, the switch provides a relatively low conductivity between its terminals to the point of being an open or nearly open circuit between the switching terminals of the switch involved. In a normally closed state, the switch provides a relatively high electrical conductivity between its terminals to the extent of approaching a short circuit between the switching terminals of the switch involved. A switching command from the switch controller will result in a normally closed switch taking on approximately the characteristic described above for the normally open switch and vice versa. In some situations, a change of state from normally closed to open, or from normally open to closed, is to result in the new state continuing without regard to the subsequent status of the controller commands, and in other situations the new state is to continue until the controller commands otherwise.

Electrical power to operate the control arrangement for the switches in many situations will be available only from one or more of the external load circuits to which the electronic switches are connected rather than being independently available to this control arrangement. If the external power is available to an electronic switch that is normally open, the closing of that switch to become a near short circuit will markedly reduce the voltage available to the controller from the external source as that electronic switch provides a high conductivity path between its terminals. Thus, a controlled electronic switch is needed which can operate with an external load circuit supplying power thereto even though the switch for this external circuit must be closed at times. In addition, a controlled switching circuit should permit other electronic switches under such control to be operated independently of changing electrical conditions in such an external load circuit supplying power including switching state changes in that circuit coming about due to the control arrangement.

SUMMARY OF THE INVENTION

The present invention provides a controlled electronic switching circuit having a plurality of switches for switching circuit arrangements in external circuits with a first one of these switches directly electrically connected to a control arrangement for these switches. As a result, an external load circuit to which the terminals of the switch are adapted to be connected can provide electrical energy to the control arrangement if so connected. At least one other switching means is provided which is electrically isolated from the control arrangement and the first switching means through being coupled to the control arrangement through an optical isolator which is operated by a controlled radiation arrangement under the direction of a controller in this control arrangement.

DETAILED DESCRIPTION OF THE PREFERRED EMBODIMENTS

Figure 1:
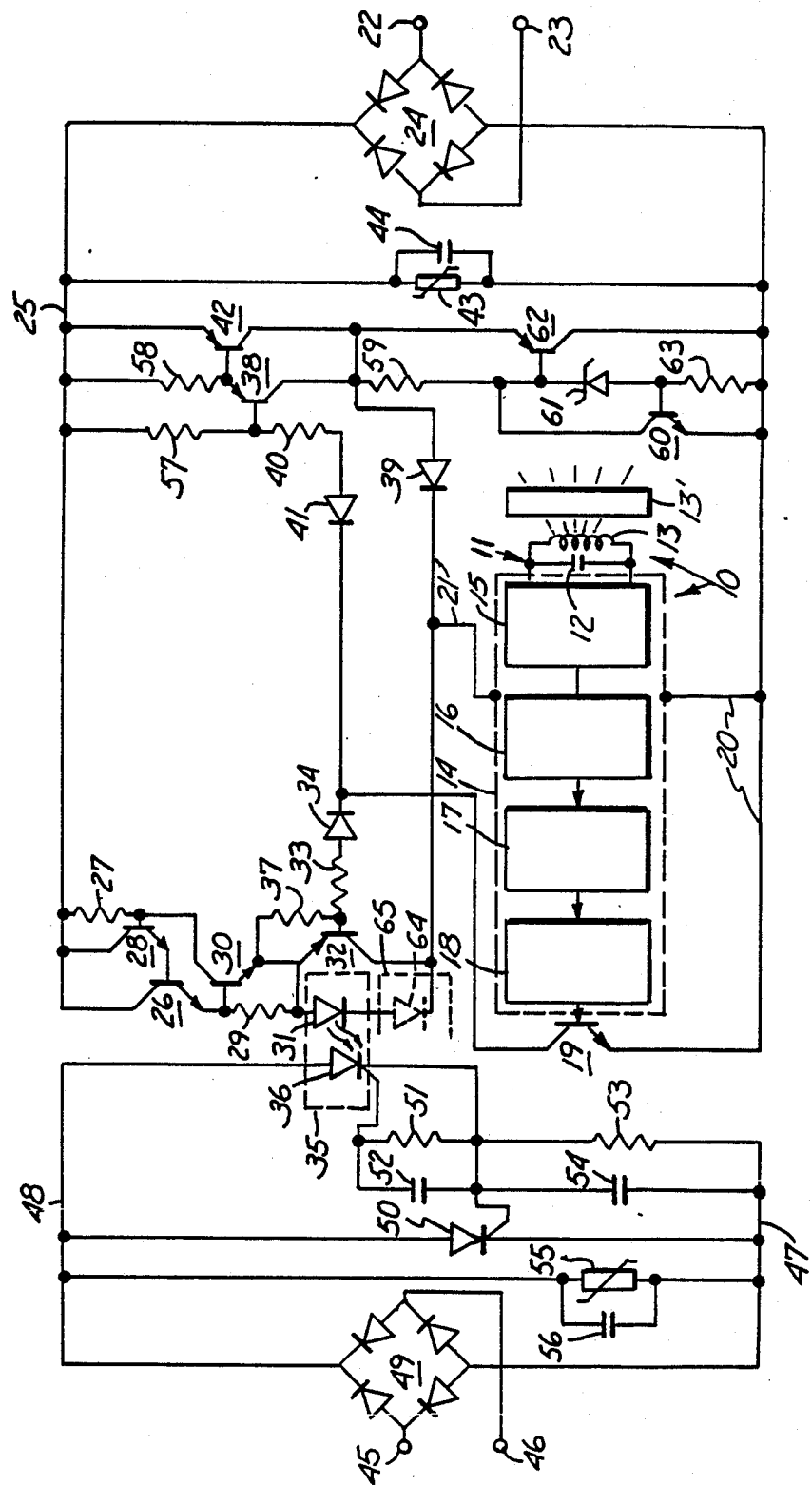
FIG. 1 shows a circuit schematic and block diagram of an embodiment of the present invention.

FIG. 1 shows a combined circuit schematic and block diagram of an embodiment of the controlled electronic switching circuit of the present invention. By way of example, the source of control commands in this circuit is provided by a proximity detector arrangement, 10, shown in both schematic diagram and block diagram form. Manual controls or other sensor or condition-based controls could be substituted for proximity sensor 10.

Proximity sensor 10 has a tuned circuit, 11, comprising a capacitor, 12, and a ferrite core inductor, 13, electrically connected in parallel with one another. Tuned circuit 11 has this parallel combination electrically connected to the signal processing portions of proximity detector 10 contained in a signal processing system, 14, shown enclosed within a dashed line box. The first block in this dashed line box of proximity sensor signal processing circuitry 14 is an oscillator, 15, to which tuned circuit 11 is electrically connected. Oscillator 15 would typically be a modified Colpitts oscillator having its oscillation frequency set primarily by tuned circuit 11.

A typical oscillation frequency would be 70 K Hz for the purposes of detecting the presence of structures containing metals. Oscillator 15, including tuned circuit 11, is set to just barely oscillate at this frequency in the absence of any materials being present near coil 13 which would significantly change electromagnetic conditions near coil 13 to cause it to behave differently. Typically, the introduction of a suitable metal-containing structure or material near coil 13 would cause increased radiation losses in such a coil, i.e. "load" the coil, through eddy currents being induced in that material by the radiation field from the coil. The arrangement of oscillator 15 with tuned circuit 11 can allow proximity sensor 10 to distinguish between proximate presence of a ferromagnetic material, which would significantly cause such increased losses, and another metal, say aluminum, which would not.

The increased losses in oscillator circuit 15 caused by the proximate presence to coil 13 of a structure containing a material which is to be sensed will, in general, add sufficient damping to oscillator circuit 15 to cause it to cease oscillation. Removal of such a structure sufficiently far from coil 13 allows oscillation to begin again in oscillator circuit 15.

This general result can be altered so as to permit, as indicated above, distinguishing between some kinds of objects subject to being sensed on the basis of the materials used in forming the object. Such a capability in sensor 10 to distinguish during sensing between electrically conductive objects comprising primarily ferromagnetic material versus those comprising primarily non-ferromagnetic material more fully established by introducing a thin metallic layer, 13′, between coil 13, approximately perpendicular to its axis, and the region in which such objects are to be detected. Metallic layer 13′ can be, in a first form, a thin disk positioned close to the ferrite cup core used with coil 13.

The sensing behavior of sensor 10 so configured depends on the thickness of metallic layer 13′ and the oscillating frequency chosen for oscillator 15. For a sufficiently thin layer and a sufficiently low oscillation frequency, the situation will be that either ferromagnetic or non-ferromagnetic electrically conductive objects can be sensed as having come within a selected sensing distance of sensor 10. This sensing is based on the object coming sufficiently close to coil 13 to extinguish or initiate oscillation in the output voltage of oscillator 15. The thinner the layer is chosen to be, the higher the oscillation frequency that can be used, as the thinness of the layer limits the eddy currents which can flow therein. The use of a higher oscillation frequency is advantageous because the higher the frequency, the quicker the oscillator begins to oscillate as an object moves away after its presence has extinguished its oscillations (or stops oscillating if its presence has initiated oscillation). This quicker recovery improves the ability of the sensor to resolve in time the relative movements of objects to be sensed.

If a layer 13′ is increased in thickness or the oscillation frequency is increased sufficiently from the previous situation, there will come a point where only ferromagnetic conductive objects will be capable of extinguishing the oscillatory behavior of the sensor oscillator and so be detected. On the other hand, at this same thickness and oscillation frequency just indicated to be used for detecting only ferromagnetic targets, the gain of the oscillator can be reduced in the absence of an object to just extinguish the oscillations through adjusting, for instance, the feedback in the oscillator. Then, the advance of a non-ferromagnetic conductive object sufficiently close to coil 13 will cause oscillator 15 output voltage oscillations to begin, but a similar advance of a ferromagnetic object would not cause the oscillations to begin.

These results come about because of the nature of the ferromagnetic and the non-ferromagnetic electrically conductive objects. The induced eddy currents in ferromagnetic objects tend to reorient the magnetic domains therein in response to the alternating magnetic field provided by coil 13. However, these domains are unable to respond as fast as the coil magnetic field alternates resulting in energy loss. Increases in these eddy currents are induced as the object nears coil 13 and continue to attempt forcing the domains to alternatingly reorient which increases the energy loss to the field from coil 13. Such losses appear as an impedance increase in coil 13 which acts to extinguish the voltage oscillations of oscillator 15.

A non-ferromagnetic electrically conductive object has no magnetic domains therein, and the induced eddy currents flow so as to induce an oppositely directed magnetic flux. This effectively acts to keep the coil induced magnetic flux out of the object so that penetration is significant to only some "skin depth." In effect, the flux lines return to coil 13 over shorter paths to reduce the energy loss from coil 13 and so enhance oscillation.

These effects are the result of coil 13 and the objects to be sensed being influenced by the presence of metallic layer 13′. Just how this influence provides the above results is not presently well understood, though complex mathematical models tend to substantiate these results.

As noted above, there is an advantage to the use of higher oscillation frequencies in providing the above-described sensing behaviors, and the use of such higher frequencies is permitted by the use of a thinner layer 13′. Discrete metallic layers cannot be conveniently made thin enough, though, to permit oscillation frequencies of much beyond 250 kHz. This limitation can be overcome by a second form based on the use of a deposited metallic film on a substrate, and such films can be deposited on the substrate by sputtering or by vapor deposition, for example. The substrate material must be sufficiently smooth to prevent any breaks or other flaws in the thin metal film deposited thereon. Glass has been found to be a suitable material for such substrates.

A deposition of aluminum 4000 Å thick on glass has been shown to be suitable to permit use of oscillation frequencies in the range of 700 kHz to 1 mHz. Use of a metal with a lower conductivity than aluminum permits a further increase in the oscillation frequency.

The output signal from oscillator circuit 15 is passed to another block, 16, serving as a half-wave rectifier. This signal in turn is passed to a further block, 17, serving as a low pass filter or a "leaky" integrator. The half-wave rectified signals from rectifier 16 are filtered in block 17 to provide a constant polarity, pulsating voltage value at the output of filter 17 if oscillator 15 is oscillating. In the absence of oscillations from oscillator 15, the signal at the output of filter 17 will be much reduced having a value near zero.

Thus, there will be two voltage value ranges available at the output of filter 17, voltages near zero when a material which can be sensed has come within the presence of coil 13 sufficiently to cause oscillations to stop in oscillator circuit 15, and another range of greater magnitude in the absence of such a material near coil 13 so that oscillator 15 provides an oscillation signal. These two filter circuit 17 output voltage value ranges are set to be on either side of the triggering voltage value of a voltage value trigger circuit, 18, to which they are provided. Trigger circuit 18 provides either a relatively low magnitude voltage value output for voltage values at its input on one voltage value side of its triggering voltage point, and a relatively large magnitude voltage value at its output for voltage signals on its input at its other voltage value side of its triggering point. If oscillator 15 is oscillating in the absence of a material being sensed near coil 13, the output voltage of trigger circuit 18 is sufficient to keep a npn bipolar transistor, 19, connected by its base to the output of trigger circuit 18, in the "off" condition. The presence of a material near coil 13 which causes sufficient radiation losses therefrom leads to transistor 19 being in the "on" condition.

Of course, for all of these actions to take place in proximity detector 10, a supply of electrical energy must be provided thereto. Thus, proximity sensor 10 is shown connected between low voltage value reference terminal, 20, which may be ground, and an electrical energy supply interconnection, 21, for proximity circuit 10. This latter connection is indicated by a vertical solid line extension of terminal 20 to the dashed line box containing proximity sensor signal processing circuitry 14. A similar vertical solid interconnection extension of proximity sensor supply voltage line 21 to the dashed line box containing proximity signal sensing circuitry 14 is also shown.

No direct power supply connections are shown to the circuit of FIG. 1 as the electrical energy for operating this circuit is to be obtained from an external load circuit connected to one of the switches in this controlled switching circuit. That external load circuit (not shown) would be connected to a pair of switch terminals, 22 and 23, which are in turn connected to a diode bridge, 24. The other connection points to diode bridge 24 are made by reference terminal 20 and by a relatively high voltage terminal, 25. Terminals 20 and 25 are the primary switching terminals for the first controlled switch in the controlled switching circuit of FIG. 1 to be described below. They are adapted to be connected to an external load circuit containing a source of electrical energy at terminals 22 and 23 through diode bridge 24.

The source of power in the external load circuit connected to terminals 22 and 23 may be either a constant polarity source of electrical power or an alternating polarity source of power since, in either case, diode bridge 24 will provide a resulting positive voltage on terminal 25 with respect to terminal 20. If the source is an alternating polarity source, the voltage on terminal 25 will be a pulsing positive voltage. On the other hand, a constant polarity, substantially constant value voltage source in the external load circuit will lead to a fairly steady voltage appearing on terminal 25 which will also be positive with respect to terminal 20.

If there is no material sensed within the vicinity of coil 13 so that transistor 19 is in the "off" condition, electrical energy for operating proximity sensor 10 will be supplied primarily through a npn bipolar transistor, 26, having its collector electrically connected to terminal 25. This will occur because the positive voltage present on terminal 25 will lead to a current flowing through a resistor, 27, which is of a large value (typically 1.0Ωm) connected between terminal 25 and the base of another npn bipolar transistor, 28, also having its collector connected to terminal 25. This current through resistor 27 will cause transistor 28 to draw current from terminal 25 through its collector which is then provided at its emitter to the base of transistor 26 to which its emitter is connected.

This emitter current of transistor 28 causes transistor 26 to draw current at its collector from terminal 25 which passes from its emitter through another resistor, 29, connected thereto and to the base of a further npn bipolar transistor, 30, which base is also electrically connected to the emitter of transistor 26. The current through resistor 29 and from the emitter of transistor 30 is passed through a light emitting diode, 31, having its anode connected to each and then to proximity detector 10 through electrical energy supply line 21 connected to the cathode of diode 31 (ignoring the dashed line diode in series with diode 31). An exception to this current flow routing can occur if this current is shunted away by a pnp bipolar transistor, 32, having its emitter connected to the emitter of transistor 30. The collector of transistor 32 is connected to line 21 so that if transistor 32 were to be placed in the "on" condition, nearly the entire current supplied by resistor 29 and transistor 30 would be shunted away to interconnecting 21 and proximity detector 10 and not passed through light emitting diode 31.

However, the base of transistor 32 is connected through a resistor, 33, and a diode, 34, to the collector of transistor 19 which is, as stated above, in the "off" condition for the current portion of the description. Thus, transistor 32 is also in the "off" condition when there is no material in the vicinity of coil 13 sufficient to cause oscillations in oscillator 15 to cease. As a result, the current supplied through resistor 29 and transistor 30 will flow through light emitting diode 31 causing light emitting diode 31 to emit light or electromagnetic radiation in the visible range of the electromagnetic spectrum. Light emitting diode 31 is part of an optical isolation component, 35, which further comprises a photo-SCR, 36. The circuit portions involving photo-SCR 36, comprising another controlled switch, will be described below.

Transistors 26, 28 and 30 along with resistors 27 and 29 together form a current limiter to supply current from terminal 25 to light emitting diode 31. Since the collector of transistor 30 is connected to the base of transistor 28, any current flowing through transistor 26 into resistor 29 exceeding the value required for the resulting voltage drop across resistor 29 to begin to cause transistor 30 to draw current from the base of transistor 30, will lead to increasing the amount of such current drawn from the base of transistor 28 through transistor 30. This increasing current shunted away by transistor 30 from the base of transistor 28 will reduce the current provided to transistor 26 by transistor 28 to just that value needed for resistor 29 to have a voltage drop thereacross that is sufficient to be across the base-emitter junction of transistor 30 to cause shunting of a corresponding amount of current away from the base of transistor 28. Thus, the selection of a resistance value for resistor 29 will set the value of the current provided by this current limiting arrangement to light emitting diode 31.

A typical value for resistor 29 would be 400Ω to provide a current of around 1.3 mA through resistor 29 and light emitting diode 31. A further resistor, 37, is present across the base-emitter junction of transistor 32 to shunt leakage currents away so that transistor 32 is always in the "off" condition unless switched into the "on" condition by transistor 19 switching into the "on" condition. Resistor 37 would have a typical resistance value of 100 kΩ.

The other possible source of power for proximity circuit 10 in the circuit of FIG. 1 must flow through the other connection made to energy supply interconnection 21. This current would need to flow through a pnp bipolar transistor, 38, and a further diode, 39, having its anode electrically connected to the collector of transistor 38 and its cathode to interconnection 21. Since, however, transistor 19 is in the "off" condition for this portion of the description, there is no base current drawn through transistor 38 which would have to pass through a resistor, 40, connected to the base of transistor 38 and through another diode, 41, having its anode electrically connected to resistor 40 and its cathode connected to the collector of transistor 19. Thus, the sole source of power for the proximity circuit 10 in the present situation with oscillator 15 oscillating so that transistor 19 is in the "off" condition, is through the current limiter in series with light emitting diode 31.

Diodes 39 and 41 are blocking diodes which prevent current from flowing into the circuit portions beyond the anodes thereof if significant current is being supplied through the current limiter. Diode 34 is also a blocking diode which prevents current from flowing into the circuit portions beyond its anode which could flow through diode 41.

Further, with transistor 38 in the "off" condition and having its emitter connected to the base of another pnp bipolar transistor, 42, that transistor is also in the "off" condition. This means there is no electrically conductive path between terminal 25 and terminal 20 other than through the current limiter and light emitting diode 31. As a result, the external load circuit connected to terminals 22 and 23 can cause the flow of only a little more than a milliamp of current therethrough. The switch between terminals 25 and 20 for this external load circuit thus appears to have a very low conductivity path therebetween or to be essentially open, that is, this switch between terminals 25 and 20 is a normally open switch in the absence of a material by coil 13 causing oscillator circuit at to cease oscillating. A varistor, 43, is connected between terminals 25 and 20 as is a capacitor, 44, for transient protection of this switch in a well known manner, but neither of these components will pass a steady current therethrough. Capacitor 44 has a typical capacitance value of 0.001 μF.

The second controlled switch shown in FIG. 1 has a pair of terminals, 45 and 46, for electrical connection to an external load circuit (not shown). This controlled switch again has a relatively low voltage terminal region, 47, and a relatively higher voltage terminal, 48. Terminals 47 and 48 are adapted for connection to the external circuit connected to terminals 45 and 46 through a further diode bridge, 49. Diode bridge 49 again acts to cause voltage supplied at terminals 45 and 46 keeping terminal 48 positive with respect to terminal 47.

The external load circuit connected to terminals 45 and 46, however, at this second switch would find it a normally closed switch, i.e. a circuit path between terminals 48 and 47 which is of a relatively high conductivity. This is because light emitting diode 31 is emitting light in optical coupler 35 which impinges on photo-SCR 36 which switches it into the "on" condition when there is a positive voltage on terminal 48. This causes a current through the anode of photo-SCR 36, connected to terminal 48, to flow out of its cathode to the gate of another SCR, 50, to which it is connected. SCR 50 has its anode electrically connected to terminal 48 and its cathode connected to terminal 47. Since, in the presently described situation, with no material near coil 13 causing oscillations in oscillator 15 to cease, light emitting diode 31 is continually emitting light intercepted by photo-SCR 36, there is a constant current flow from photo-SCR 36 to the gate of SCR 50 whenever terminal 48 is significantly positive with respect to terminal 47.

Thus, in these circumstances, SCR 50 will be in the "on" condition whenever terminal 48 is positive with respect to terminal 47.

Because SCR 50 is a unilateral device, only alternating polarity voltage and current can be used in the external load circuit connected to terminals 45 and 46 if proximity detector 10 is to continually be able to control the state of this second controlled switch. Alternating voltage will result in the voltage across SCR 50 going to zero every time the polarity switches to thereby temporarily cause SCR 50 to switch into the "off" condition. As soon as the voltage magnitude rises significantly between terminals 45 and 46 in either polarity direction, SCR 50 will switch back into the "on" condition because of the current supplied by photo-SCR 36 whenever terminal 48 is significantly positive in respect to terminal 47.

This normally closed second controlled switch, if it is to be opened by a material in the vicinity of coil 13 causing oscillator circuit 15 to cease oscillation, will do so since there would then not be any light emitted by light emitting diode 31 as will be described below. Once SCR 50 went to the "off" condition because of a polarity reversal, it would not be returned to the "on" condition in the absence of a gate current being provided thereto by photo-SCR 36 in the absence of light impinging thereon. If a constant polarity source is used in the external load circuit, this normally closed second controlled switch could not be switched off since the voltage between terminals 48 and 47 would not go to zero. Use of alternative circuit components for SCR 50 will permit the use of a constant polarity power supply in the external load circuit as will be described below.

A resistor, 51, of typically 100Ω and a capacitor, 52, of typically 0.01 μF are connected between the gate and the cathode of photo-SCR 36. Similarly, a resistor, 53, of 100Ω and a capacitor, 54, again of 0.01μF are connected between the gate of SCR 50 and its cathde. Resistors 51 and 53 and capacitors 52 and 54 prevent noise and transients from triggering either of SCR's 36 and 50 into the "on" condition at times they should not be so switched. Again, a varistor, 55, is connected between terminals 48 and 47 as is a capacitor, 56, typically of 0.001 μF, for surge and transient protection of the components present in this second controlled switch.

A command for changing the state of the controlled switches will be provided by proximity sensor 10, being controller, as the result of the introduction of a material in the vicinity of coil 13 which causes oscillator 15 to cease its oscillations. This results in transistor 19 being switched into the "on" condition. Since the collector of transistor 19 is electrically connected to the cathodes of diodes 34 and 41, and its emitter is connected to terminal 20, these cathodes will be brought to the voltage level of terminal 20. This event switches transistor 32 into the "on" condition shunting the current supplied through resistor 29 and the emitter of transistor 30 around light emitting diode 31. Thus, light emitting diode 31 stops emitting light to impinge on photo-SCR 36. After the next polarity crossing in which SCR 50 switches into the "off" condition, the second switch goes to the open condition of having a very low conductivity path between terminals 48 and 47. This occurs, as indicated above, because there is no longer any current supplied by photo-SCR 36 to the gate of SCR 50 to switch it back into the "on" condition.

Current is also drawn by transistor 19 through resistor 40 and diode 41 from the base of transistor 38 and from a further resistor, 57, connected between terminal 25 and the base of transistor 38. The current drawn through the base of transistor 38 is supplied at the emitter of transistor 38 from a further resistor, 58, connected thereto from terminal 25, and from the base of transistor 42. Resistor 57, typically of 100 kΩ in value, shunts leakage currents past the base-emitter junction of transistor 38, and resistor 58, which also typically has a value of 100 kΩ, serves to shunt leakage currents past the base-emitter junction of transistor 42. Resistor 40 which has a resistance value of 10 kΩ is used to limit the current which can be drawn by transistor 19 through the base-emitter junctions of transistors 38 and 42 from terminal 25.

This current drawn by transistor 19 through the base-emitter junctions of transistors 38 and 42 switches each of them into the "on" condition. The current thereby provided from the commonly connected collectors of transistors 38 and 42 is supplied to a further resistor, 59, the collector of a further npn bipolar transistor, 60, and to the anode of diode 39, all of which are connected to the collectors of transistors 38 and 42.

The current supplied to resistor 59 is further supplied to a Zener diode, 61. Resistor 59 has the base-emitter of a further pnp bipolar transistor, 62, connected thereacross so that the emitter of transistor 62 is also connected to the collectors of transistors 38 and 42. The current through Zener diode 61 is provided both to a further resistor, 63, electrically connected between its anode and terminal 20, and to the base of transistor 60.

The switching into the "on" condition of transistors 38 and 42 will permit an increasing current to flow in the external load circuit and through these transistors, and part of this increasing current will flow through resistor 59, Zener diode 61 and resistor 63. Resistor 59 has a typical resistance value of 10Ω and resistor 63 has a typical resistance value of 120Ω. This increase in current will cause a voltage drop across resistors 59 and 63 which will first cause the base-emitter junction of transistor 60 to just become forward biased.

Any further increases in this current will increase the base current in transistor 60 and cause the collector of transistor 60 to draw an increasing amount of the current supplied by the collectors of transistors 38 and 42 which will then flow out the emitter of transistor 60 to terminal 20 to which it is connected. Transistor 60 will increase the current drawn therethrough to the extent needed to keep its collector at a voltage above its base that is approximately equal to the breakdown voltage of Zener diode 61, typically 4.3 volts. This occurs because as any tendency to increase the voltage drop between its collector and its base will lead to an increase in the current flowing through Zener diode 61 which will lead to a greater current flowing into the base of transistor 60 thereby increasing the current drawn at its collector.

Though the resistance value of resistor 59 is small, the increase in voltage drop thereacross in response to increasing currents flowing in the external load circuit, and so through resistor 59 and Zener diode 61 into the base of transistor 60, will finally reach a value sufficient to forward bias the base-emitter junction of transistor 62. This condition will cause transistor 62 to also begin to draw current at its emitter from the collectors of transistors 38 and 42 and pass this current through its collector to terminal 20 to which the collector of transistor 62 is connected. Thus, the voltage at the collectors of transistors 38 and 42 will, after oscillations in oscillator circuit 15 cease, come to the value of the breakdown voltage of Zener diode 61 plus the base-emitter voltage drops of both transistors 60 and 62. As a result, a regulated voltage is provided between the collectors of transistors 38 and 42 and terminal 20 in the situation of oscillator circuit 15 having ceased oscillation to switch transistor 19 into the "on" condition.

Transistor 19 will draw sufficient current from the base of transistor 38 to thereby cause it to draw sufficient current from the base of transistor 42 to keep the voltage drop between the emitter and collector thereof at its saturation voltage, typically a few tenths of a volt. Thus, the entire voltage drop between terminals 25 and 20 will be around 6.0 volts for whatever current flow (within the transistor limits) occurs between terminals 25 and 20 in response to conditions in the external load circuit. In this situation, a relatively high conductivity path is provided between terminals 25 and 20 so that the normally open controlled switch with these terminals is in the closed state in response to material being placed in the vicinity of coil 13 sufficient to cause oscillator 15 to cease oscillations.

This low voltage of a few tenths of a volt across transistor 42 in effect eliminates nearly all the flow through the current limiter supplying light emitting diode 31. Thus, transistor 32, now in the "on" condition as described above, need only shunt leakage currents around light emitting diode 31. The voltage mentioned at the collectors of transistors 38 and 42 provides a regulated voltage with the switch between terminals 25 and 20 closed for proximity detector 10. This voltage, less the forward voltage drop across diode 39, is provided to interconnection 21 for proximity detector 10. Thus, power for proximity detector 10 is provided from the external load circuit source, either of constant or alternating polarity, alternatively through diode 31 or diode 39 depending on whether (i) the presence of materials which can be sensed has caused oscillator circuit 15 to cease oscillation and switch transistor 19 into the "on" condition or (ii) the absence of such materials has left oscillator circuit 15 oscillating and transistor 19 in the "off" condition.

Returning now to the dashed line diode, designated 64, which forms part of an optical coupling component, 65, the photoreceptor therein could be another photo-SCR such as photo-SCR 36. That is, another switch circuit of the kind containing photo-SCR 36 could be provided to be operated by light emitting diode 64 along with operating the switch circuit containing photo-SCR 36.

Figure 2:
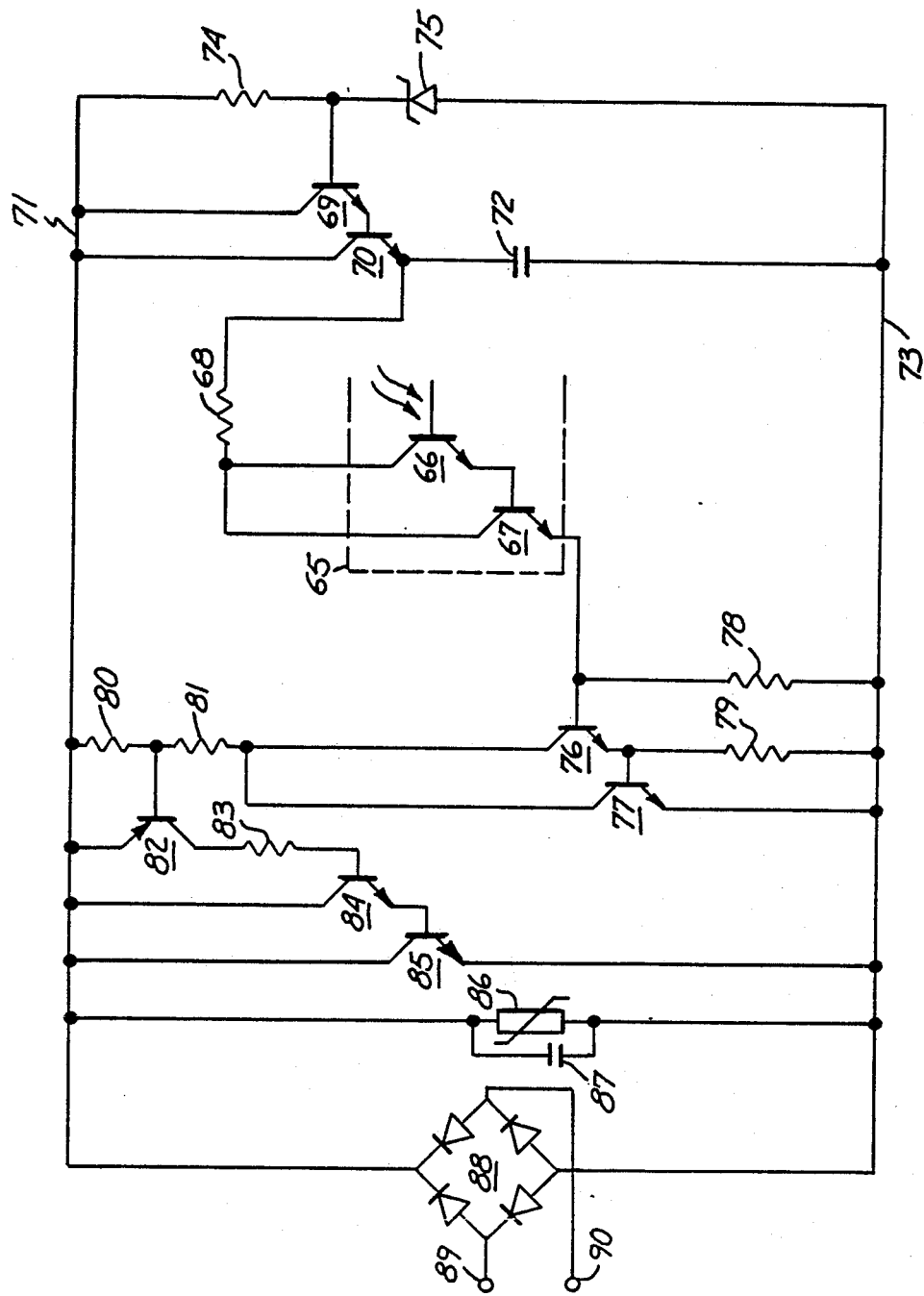
FIG. 2 shows a circuit schematic diagram of an alternative embodiment which is a supplement to the present invention.

Alternatively, FIG. 2 shows another photoreceptor for optical coupler 65 which comprises a photo-Darlington circuit comprising a npn phototransistor, 66, which operates another npn bipolar transistor, 67, as part of this Darlington circuit. The emitter of transistor 66 is electrically connected to the base of transistor 67 and the collectors of each are connected together and to a further resistor, 68, which typically has a value of 2 kΩ. This resistor limits the current which flows through the photo-Darlington circuit comprising transistors 66 and 67 supplied from a voltage regulator circuit having a further Darlington circuit therein.

This voltage regulator Darlington circuit has a npn bipolar transistor, 69, with its emitter connected to the base of another npn bipolar transistor, 70. The collectors of transistors 69 and 70 are connected together and to a positive voltage terminal, 71. The emitter of transistor 70 is connected to a capacitor, 72, with a typical value of 4.7 μF. The other side of capacitor 72 is connected to a low voltage or reference terminal, 73. A further resistor, 74, having a typical resistance value of 470Ωk is connected between terminal 71 and the base of transistor 69. A Zener diode, 75, of a typically 10 volt breakdown voltage, is connected between the base of transistor 69 and terminal 73. Current flowing through resistor 74 causes the Zener diode to break down to provide a voltage reference with respect to terminal 73. Resistor 74 supplies some current also into the base of transistor 69 which then draws current at its collector to be provided at its emitter to the base of transistor 70. As a result, capacitor 72 is charged from the emitter of transistor 70 to a voltage value equal to the breakdown voltage of Zener 75 less the voltage drops across the base-emitter junctions of transistors 69 and 70.

The irradiation of phototransistor 66 by light emitting diode 64 causes a current drawn at its collector to flow from its emitter to the base of transistor 67. A current flows from the emitter of transistor 67, drawn from the, collector, to the base of a further npn bipolar transistor, 76. Current thereby drawn at the collector of transistor 76 passes through the emitter of this transistor to the base of yet another npn bipolar transistor, 77. The base of transistor 76 has a further resistor, 78, connected between it and terminal 73, while the base of transistor 77 also has another resistor, 79, connected between it and terminal 73. Resistors 78 and 79 shunt leakage currents across the base-emitter junctions of transistors 76 and 77, respectively, and typically each have a resistance value of 39 kΩ. The emitter of transistor 77 is also connected to terminal 73.

Transistors 76 and 77 form a Darlington circuit which, if driven by current from the emitter of transistor 67, draw current through two further series resistors, 80 and 81. Resistor 80 is typically 80 kΩ in value, and resistor 81 is typically of 2 kΩ in value. These two resistors form a voltage divider and have the base of a pnp bipolar transistor, 82, connected at the junction formed by these two resistors being connected together.

The emitter of transistor 82 is connected to terminal 71 and the collector of transistor 82 is connected through a further resistor, 83, to the base of a further npn bipolar transistor, 84. Resistor 83 has a typical resistance value of 62Ω. The emitter of transistor 84 is connected to the base of a further npn bipolar transistor, 85. The collectors of transistors 84 and 85 are connected together and to terminal 71 to thereby form a further Darlington circuit. The emitter of transistor 85 is connected to terminal 73 and forms the primary current carrying component of this switch circuit between terminals 71 and 73.

There is also provided transient voltage protection by a further varistor, 86, and a capacitor, 87, both of which are connected between terminals 71 and 73. Capacitor 87 has a typical capacitance value of 0.001 µF.

Terminals 71 and 73 are again adapted to be connected to an external load circuit through a diode bridge, 88, which is connected to a pair of terminals, 89 and 90, at which such an external load circuit can be connected. Terminal 71 is made positive with respect to terminal 73 by an electrical energy source in this external load circuit through terminals 89 and 90 by the action of diode bridge 88.

The circuit shown in FIG. 2 can accept both an alternating polarity and a constant polarity electrical energy source in the external load circuit since the transistors carrying the primary current load through the switch shown in FIG. 2, transistors 84 and 85, will be switched between the "on" and "off" conditions by the providing to, and withholding from, phototransistor 66 electromagnetic radiation through controlling the current flowing through light emitting diode 64. This is in contrast to the switch containing photo-SCR 36 in FIG. 1 which at the primary current carrying component, SCR 50, is latched into the "on" condition indefinitely until the current flow goes to near zero value in the external load circuit.

Although the present invention has been described with reference to preferred embodiments, workers skilled in the art will recognize that changes may be made in form and detail without departing from the spirit and scope of the invention.

What is claimed is:

1. A switching circuit for controlling a plurality of external load circuits under direction of a control arrangement electrically isolated from at least one of said external load circuits, said control arrangement being capable of operating with electrical energy received from a source thereof in one of said external load circuits, said switching circuit comprising:

a first switching means having first and second switching terminals, a supply terminating region, and a control region by which said switching means is capable of being directed, through electrical energization thereof, to effectively provide a conductive path of a selected conductivity between said first switching means first and second switching terminals and between said first switching means first switching terminal and its supply terminating region, said first switching means first and second switching terminals being adapted for electrical connection to a selected one of said plurality of external load circuits;

a second switching means having first and second switching terminals and a control region by which said switching means is capable of being directed, through being irradiated by electromagnetic radiation, to effectively provide a conductive path of a selected conductivity between said second switching means first and second switching terminals, said second switching means first and second switching terminals being adapted for electrical connection to a selected one of said plurality of said external load circuits;

a controlled radiation source means having first and second energization regions between which a radiation emitting device is electrically connected, said radiation emitting device being capable of emitting electromagnetic radiation for sufficient current passing therethrough drawn from that current, if any, flowing between said controlled radiation source means first and second energization regions, said radiation emitting device being positioned to irradiate said second switching means control region, said controlled radiation source means first energization region being electrically connected to said first switching means first switching terminal; and a controller having first and second energizing regions and first and second output regions, said controller being capable, if electrically energized at its energizing regions, of selectively being directed to effectively provide a conductive path of a selected conductivity between said controller first and second output regions, said controller first energizing region being electrically connected to said controlled radiation source means second energization region and to said first switching means supply terminating region, said controller second energizing region being electrically connected to said first switching means second switching terminal, said controller first output region being electrically connected to said first switching means control region, and said controller second output region being electrically connected to said first switching means second switching terminal.

2. The apparatus of claim 1 wherein said controlled radiation source means has a control region capable of selectively causing, through electrical energization thereof, current to flow through said radiation emitting device drawn from current flowing between said controlled radiation source means first and second energizing regions, if any.

3. The apparatus of claim 1 wherein said switching circuit further comprises a plurality of switching means, including said second switching means, each having a first and second switching terminals and a control region by which it is capable of being directed, through electromagnetic radiation thereof, to effectively provide a conductive path of a selected conductivity between its said first and second switching terminals with its first and second switching terminals being adapted for electrical connection to a selected one of said plurality of external load circuits, and wherein said controlled radiation source means further comprises a plurality of radiation emitting devices each being capable of emitting electromagnetic radiation for sufficient current passing therethrough drawn from that current, if any, flowing between said controlled radiation source means first and second energization regions and each being positioned to emit electromagnetic radiation toward a control region in a corresponding one of said plurality of said switching means.

4. The apparatus of claim 1 wherein said controller contains a proximity sensor which senses occurrences of objects coming within a selected range thereof, said proximity sensor in sensing proximity of such objects thereby serving to direct provision of conductive paths between said controller first and second output regions.

5. The apparatus of claim 1 wherein establishment of a relatively low conductivity path between said controller first and second output regions leads to a relatively low conductivity path between said first switching means first and second switching terminals.

6. The apparatus of claim 1 wherein at least one of said first and second switching means has its first and second switching terminals adapted for electrical connection to a said external load circuit through a diode bridge.

7. The apparatus of claim 1 wherein a voltage setting means is provided between said first switching means supply terminating region and its second switching terminal, said voltage setting means being capable of establishing a selected voltage value between said first switching means supply terminating region and second switching terminal if said first switching means is caused to have a relatively high conductivity path established between its said first and second switching terminals and sufficient current flows therebetween.

8. The apparatus of claim 1 wherein said controlled radiation source means has a current limiter in series with said radiation emitting device to limit magnitudes of any currents flowing therethrough.

9. The apparatus of claim 2 wherein establishment of a relatively low conductivity path occurring between said controller first and second output regions leads to a relatively low conductivity path to occur between said first switching means first and second switching terminals and a relatively high conductivity path to occur between said second switching means first and second switching terminals.

10. The apparatus of claim 3 wherein establishment of a relatively low conductivity path occurring between said controller first and second output regions leads to a relatively low conductivity path occurring between said first switching means first and second switching terminals and between first and second switching terminals of selected ones of said plurality of switching means but a relatively high conductivity path between first and second switching terminals of others of said plurality of switching means.

11. The apparatus of claim 4 wherein said sensor has a tuning circuit by which it senses objects coming into its proximity, said tuning circuit being tuned to a frequency so that said sensor senses proximity of some kinds of metals brought nearby to it but not proximate of other kinds of metals.

12. The apparatus of claim 7 wherein establishment of a relatively high conductivity path between said first switching means first and second switching terminals leads to a voltage therebetween which is approximately that voltage established by said voltage setting means if a sufficient current flows between said first switching means first and second switching terminals.

13. The apparatus of claim 11 wherein said tuning circuit comprises an oscillator circuit means containing a coil which provides an oscillating magnetic field in its vicinity as a result of oscillatory circuit behavior of said oscillator circuit means, there being an electrically conductive layer located between said coil and that portion of its vicinity in which proximity of objects is to be detected.

14. The apparatus of claim 13 wherein said electrically conductive layer is provided as a deposited metallic layer on a smooth surface substrate.

15. The apparatus of claim 14 wherein said substrate is of glass.

16. The apparatus of claim 15 wherein said deposited metallic layer is of aluminum.

17. The apparatus of claim 15 wherein said deposited layer has a thickness less than 5000 A.

* * * * *